(12) United States Patent
Baker

(10) Patent No.: US 7,205,756 B1
(45) Date of Patent: Apr. 17, 2007

(54) UNBALANCED CURRENT DETECTION

(75) Inventor: Donal E. Baker, Rockford, IL (US)

(73) Assignee: Hamilton Sundstrand Corporation, Rockford, IL (US)

( * ) Notice: Subject to any disclaimer, the term of this patent is extended or adjusted under 35 U.S.C. 154(b) by 0 days.

(21) Appl. No.: 11/254,128

(22) Filed: Oct. 19, 2005

(51) Int. Cl.
G01R 25/00 (2006.01)
H02H 3/00 (2006.01)

(52) U.S. Cl. .................. 324/86; 324/772; 324/107; 361/78; 361/79

(58) Field of Classification Search .................. 324/86, 324/132
See application file for complete search history.

(56) References Cited

U.S. PATENT DOCUMENTS

| | | | | |
|---|---|---|---|---|
| 4,423,374 A | * | 12/1983 | Hansen, Jr. .................. | 324/86 |
| 4,641,088 A | * | 2/1987 | Jacobsson .................... | 324/86 |
| 4,970,458 A | * | 11/1990 | Fox ............................. | 324/132 |
| 5,298,885 A | * | 3/1994 | McEachern et al. ........ | 340/660 |
| 5,523,938 A | | 6/1996 | Wagner et al. | |
| 5,838,510 A | * | 11/1998 | Inbar ........................... | 360/46 |
| 6,501,329 B1 | * | 12/2002 | Petrofsky et al. ........... | 327/552 |

\* cited by examiner

*Primary Examiner*—John Zhu
(74) *Attorney, Agent, or Firm*—Carlson, Gaskey & Olds

(57) ABSTRACT

An unbalanced current detection circuit determines when a multi-phase, normally-balanced load is unbalanced. The detection circuit of the present invention includes a plurality of current-squaring circuits, each squaring a sensed current of one of the phases. A summing circuit produces a sum of the squares of the currents. If the load is balanced, this sum should be relatively constant, perhaps changing only slowly over time, with little or no ripple from that relatively constant value. In an unbalanced current condition, the sum of the current squares would consist of an average (dc) component plus a ripple (ac) component. If the amplitude of the ripple current exceeds a threshold, it is determined that the currents are unbalanced.

14 Claims, 2 Drawing Sheets

UNBALANCED CURRENT DETECTION

BACKGROUND OF THE INVENTION

The present invention relates generally to a circuit for detecting unbalanced currents in a normally balanced multi-phase load, such as a three-phase motor.

In aircraft applications there are power system architectures that employ three-phase circuits. Some of these applications have three phase loads that are inherently balanced loads. For example, on equipment such as a motor drive, the load is a balanced three-phase load and the source voltage driving this load is also a balanced three-phase source. It is desired, for overall system power distribution protection, to detect unbalanced currents in a normally balanced three phase load.

For normal motor speed and torque control functions, the associated motor drive incorporates current sensing on the motor power line. Thus, the motor currents are already available for this unbalanced phase current detection function. However, because the current level provided to the lower is variable (but balanced) it is necessary to determine the existence of unbalanced current over a wide range of possible current levels. Also, because the motor operates over a wide range of speeds, it is necessary to determine the existence of unbalanced currents over a wide fundamental frequency range.

SUMMARY OF THE INVENTION

The present invention provides an unbalanced current detection circuit for determining when a multi-phase normally balanced load is unbalanced. The detection circuit includes a plurality of current-squaring circuits, each squaring a sensed current of one phase. A summing circuit produces a sum of the squares of the currents. If the load is balanced, this sum should be relatively constant, changing only slowly over time, with no ripple from that relatively constant value. In an unbalanced current condition, the sum of the current squares would not be a constant value, but instead would consist of an average (dc) component plus a ripple (ac) component that is related to the fundamental frequency and the degree of unbalance. Detection of the amplitude of the ripple component is used to determine if the line currents are balanced. If the amplitude of the ripple current exceeds a threshold, it is determined that the currents are unbalanced.

To determine whether the sum of the square of currents is constant, a first filter is tied to the sum. The first filter provides a time averaging function over multiple cycles (e.g., ten or more cycles). Generally, this first filtered sum is compared to the sum (which may be filtered) to determine whether an instantaneous value exceeds the time-averaged value.

BRIEF DESCRIPTION OF THE DRAWINGS

Other advantages of the present invention can be understood by reference to the following detailed description when considered in connection with the accompanying drawings wherein.

DETAILED DESCRIPTION OF THE PREFERRED EMBODIMENTS

Figure 1:
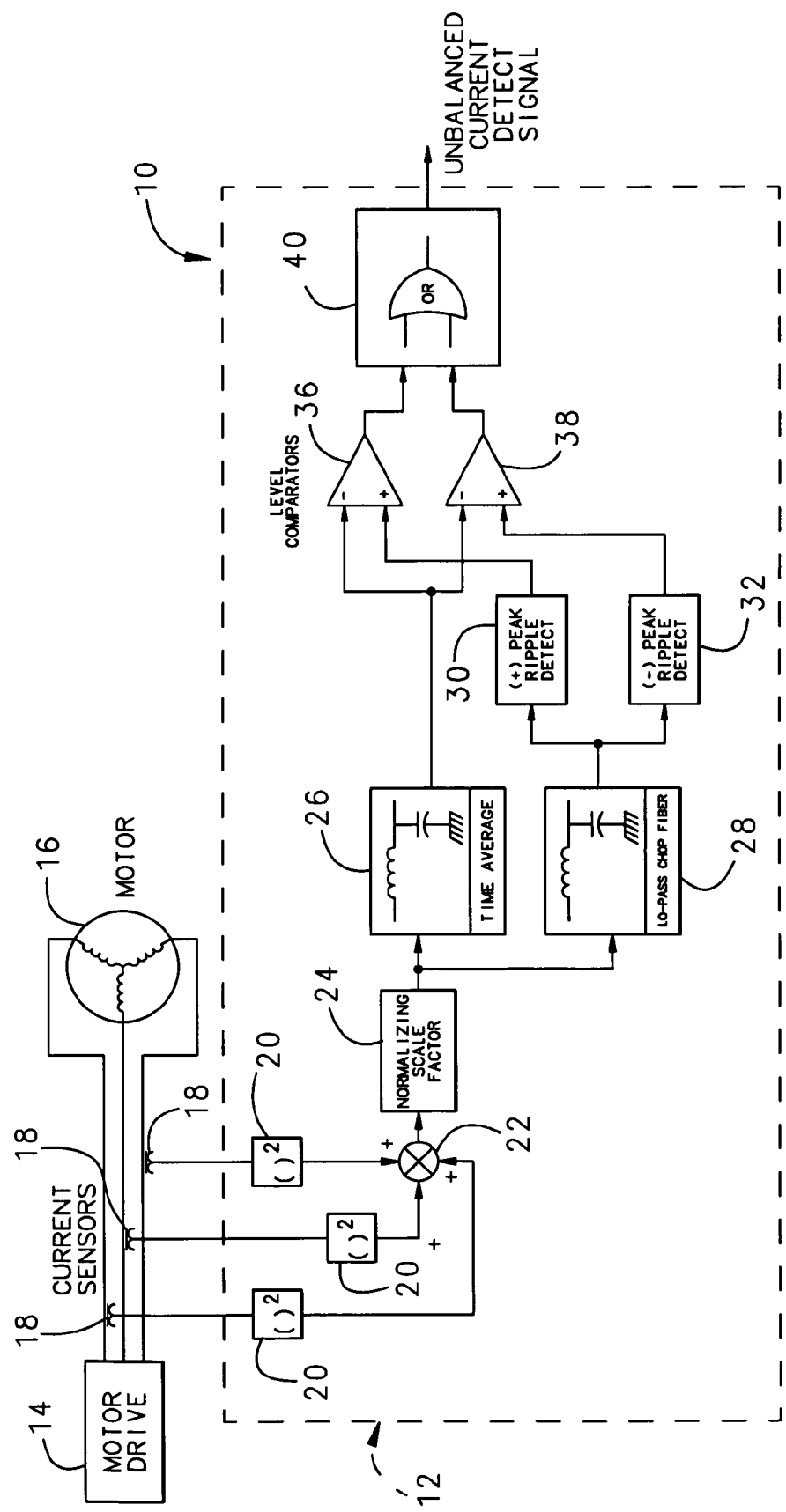
FIG. 1 is a schematic of a first embodiment of an unbalanced current detection circuit of the present invention monitoring a multi-phase current between the load and the source.

A power system 10 is shown schematically in FIG. 1 and includes an unbalanced current detection circuit 12 according to the present invention monitoring current provided by a source or motor drive 14 to a load or motor 16. The unbalanced current detection circuit 12 monitors the current between the motor drive 14 and the motor 16 via current sensors 18, one on each phase. Although three phases are shown, more phases could also be monitored in this manner. Also, two phase systems could be monitored in this manner.

The unbalanced current detection circuit 12 includes a plurality of current-squaring circuits 20, each squaring the current measured by one of the current sensors 18. The squared currents are then summed by summation circuit 22 and normalized or scaled by a scaling circuit 24, depending upon the relative voltages output by the summation circuit 22 and utilized by the remainder of the current detection circuit 12.

The scaled sum of the squared currents is sent to a first filter 26 and a second filter 28. The first filter 26 generally performs a time averaging function and may be a low pass filter that averages the signal over several cycles of the motor drive 14, preferably ten or more cycles, i.e. one tenth of the motor drive frequency. The second filter 28 is also a low pass filter having a cutoff frequency higher than the frequency of the motor drive 14, preferably ten to one hundred times the frequency of the motor drive 14. Thus, the output of the second filter 28 will be the average component plus the ripple component, while the output of the first filter 26 will only be the average, or dc component without the ripple component.

A positive peak ripple detection circuit 30 and a negative peak ripple detection circuit 32 are connected to the output of the second filter 28. The positive peak ripple detection circuit 30 outputs a value equal to the positive peak of the ripple component from the second filter 28, while the negative peak ripple detection circuit 32 outputs the negative peak of the ripple from the second filter 28. Various configurations of the positive peak ripple detection circuit 30 and the negative peak ripple detection circuit 32 could be implemented with analog circuitry or in software.

The outputs of the peak ripple detection circuits 30, 32 are sent to comparators 36 and 38, respectively. The other inputs to the comparators 36, 38 are connected to the first filter 26. Thus, the average or dc component from the first filter 26 is compared to the positive peak of the ripple from positive peak ripple detection circuit 30 and to the negative peak from the negative peak ripple detection circuit 32. If desired, the outputs of the comparators 36, 38 can be connected to an OR circuit 40, thereby generating a signal that indicates when the currents from the motor drive 14 are determined to be unbalanced, which may be indicative of a motor 16 that is failing or of a motor drive 14 that is failing.

Figure 2:
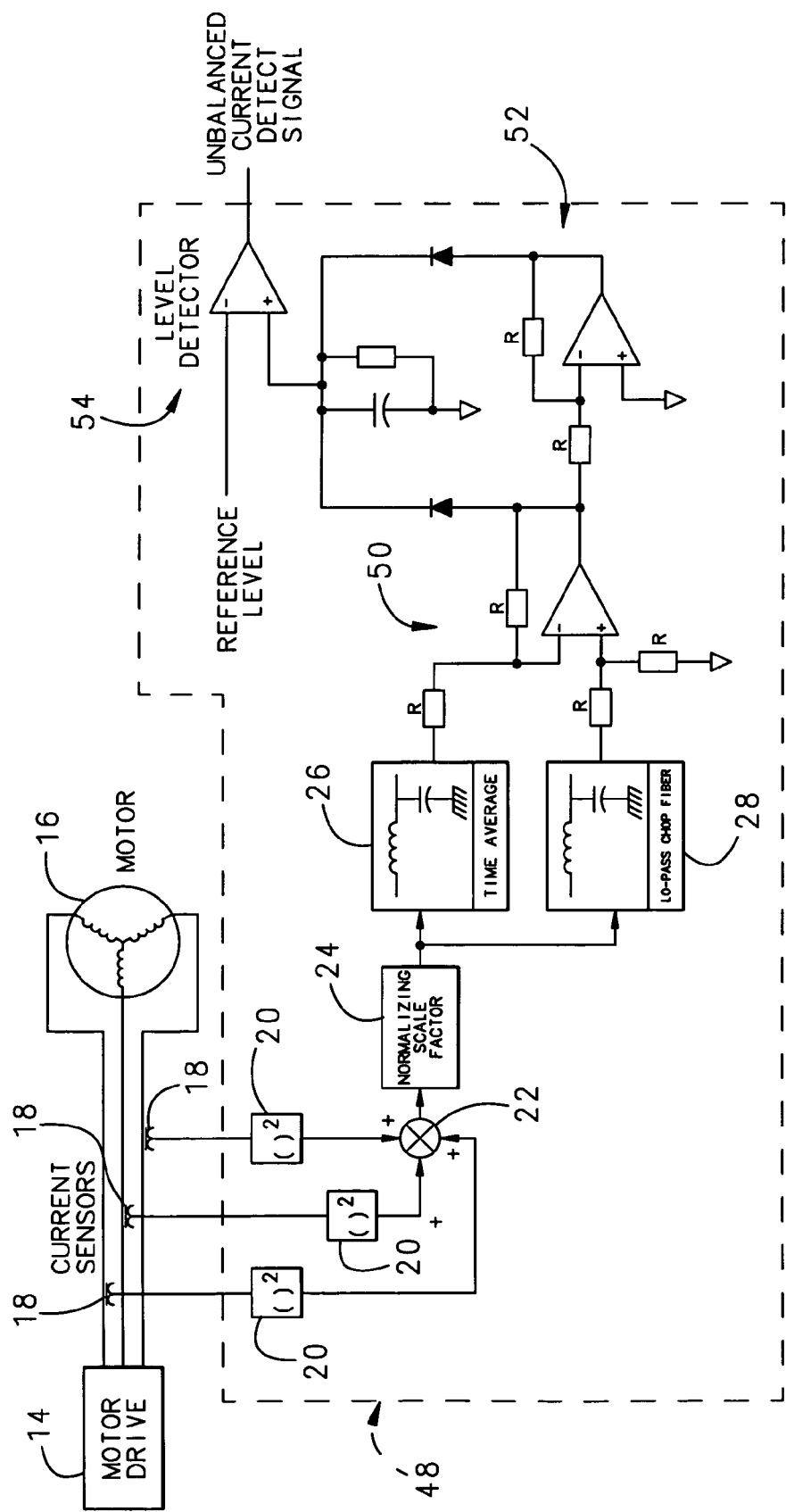
FIG. 2 is a schematic similar to that of FIG. 1, showing an alternate embodiment of the ripple detection circuits.

FIG. 2 is a schematic similar to that of FIG. 1, showing an alternate embodiment of an unbalanced current detection circuit 48 according to the present invention, where common elements are indicated with identical reference numerals. In the unbalanced current detection circuit 48, the signals from the first filter 26 and the second filter 28 are sent to a comparator 50, which outputs a signal representing the ripple component. A rectifier circuit 52 inverts the negative peaks of the ripple component and both peaks are averaged and sent to a level detector 54. When the average rectified values of the peaks of the ripple component exceed a threshold (i.e. the reference level), an unbalanced current is indicated.

In accordance with the provisions of the patent statutes and jurisprudence, exemplary configurations described above are considered to represent a preferred embodiment of the invention. However, it should be noted that the invention can be practiced otherwise than as specifically illustrated and described without departing from its spirit or scope.

What is claimed is:

1. An unbalanced current detection circuit comprising:
a plurality of current-squaring circuits, each having an output;
a summing circuit generating a sum of the outputs of the current-squaring circuits;
a first filter filtering the sum, the first filter is a low pass filter having a cutoff frequency lower than an expected input frequency of the currents to be squared by the plurality of current-squaring circuits;
a second filter filtering the sum, the second filter having a frequency response different from the first filter; and
a first comparator comparing the first filtered sum to the the second filtered sum and generating a signal based upon the comparison.

2. The unbalanced current detection circuit of claim 1 wherein the plurality of current-squaring circuits includes three current-squaring circuits.

3. A power system including a three-phase power source having three output nodes, each connected to one of the three current-squaring circuits of claim 2.

4. An unbalanced current detection circuit comprising:
a plurality of current-squaring circuits, each having an output;
a summing circuit generating a sum of the outputs of the current-squaring circuits;
a first filter filtering the sum;
a second filter filtering the sum, the second filter having a frequency response different from the first filter, wherein the first filter and the second filter are low pass filters and the first filter has a lower cutoff frequency than the second filter; and
a first comparator comparing the first filtered sum to the second filtered sum and generating a signal based upon the comparison.

5. An unbalanced current detection circuit comprising:
a plurality of current-squaring circuits, each having an output;
a summing circuit generating a sum of the outputs of the current-squaring circuits;
a first filter filtering the sum;
a second filter filtering the sum, the second filter having a frequency response different from the first filter;
a first peak ripple detection circuit detecting a peak value output from the second filter; and
a first comparator comparing the peak value to the first filtered sum and generating a signal based upon the comparison.

6. The unbalanced current detection circuit of claim 5 wherein the first peak ripple detection circuit detects a positive peak value, the unbalanced current detection circuit further including a second peak ripple detection circuit detecting a negative peak value of the second filtered sum.

7. The unbalanced current detection circuit of claim 6 further including a second comparator comparing the negative peak value to the first filtered sum.

8. An unbalanced current detection circuit comprising:
a plurality of current-squaring circuits, each having an output;
a summing circuit generating a sum of the outputs of the current-squaring circuits;
a first filter filtering the sum;
a second filter filtering the sum, the second filter having a frequency response different from the first filter;
a first comparator comparing the first filtered sum to the second filtered sum and generating a ripple component; and
a rectifier rectifying the ripple component.

9. The unbalanced current detection circuit of claim 8 further including a comparator comparing an average of the rectified ripple component to a reference to detect unbalanced currents.

10. A method for detecting unbalanced currents including the steps of:
a) squaring the currents detected in each phase of a multi-phase power system;
b) summing the squares of the currents;
c) averaging the sum of the squares of the currents over time prior to said step d);
d) comparing the average sum to the sum of the squares of the currents from said step b);
e) rectifying a difference between the average sum and the sum from said step d);
f) comparing an average of the rectified difference to a threshold to detect unbalanced currents;
g) detecting a change in the sum of the squares of the currents based upon said step f); and
h) generating a signal based upon said step g).

11. The method of claim 10 further including the steps of:
i) filtering the sum of the squares of the currents with a first filter prior in said step c); and
j) comparing the first-filtered sum to the sum in said step d).

12. The method of claim 11 further including the step of:
k) filtering the sum of the squares of the currents with a second filter prior to said step d); and
l) comparing the first-filtered sum to the second-filtered sum in said step j).

13. The method of claim 12 further including the steps of:
m) rectifying a difference between the first-filtered sum and the second-filtered sum in said step e); and
n) comparing an average of the rectified difference to a threshold to detect unbalanced currents in said step f).

14. An unbalanced current detection circuit comprising:
a plurality of current-squaring circuits, each having an output;
a summing circuit generating a sum of the outputs of the current-squaring circuits;
a first filter filtering the sum;
a second filter filtering the sum;
a first comparator comparing the first filtered sum to the second filtered sum and generating a signal based upon the comparison, wherein the signal from the first comparator is a ripple component;
a rectifier rectifying the ripple component; and
a second comparator comparing an average of the rectified ripple component to a reference, the second comparator generating a signal indicative of unbalanced currents based upon the comparison of the average of the rectified ripple component with the reference.

* * * * *

UNITED STATES PATENT AND TRADEMARK OFFICE
CERTIFICATE OF CORRECTION

PATENT NO. : 7,205,756 B1  Page 1 of 1
APPLICATION NO. : 11/254128
DATED : April 17, 2007
INVENTOR(S) : Donal E. Baker It is certified that error appears in the above-identified patent and that said Letters Patent is hereby corrected as shown below:

Claim 11, Column 4, line 35: delete "prior"

Signed and Sealed this

Twenty-sixth Day of June, 2007

JON W. DUDAS
*Director of the United States Patent and Trademark Office*